United States Patent
Bennett et al.

(10) Patent No.: US 7,074,109 B1
(45) Date of Patent: Jul. 11, 2006

(54) CHEMICAL MECHANICAL POLISHING CONTROL SYSTEM AND METHOD

(75) Inventors: Doyle E Bennett, Santa Clara, CA (US); Jeffrey Drue David, San Jose, CA (US); Manoocher Birang, Los Gatos, CA (US); Jimin Zhang, San Jose, CA (US); Boguslaw A Swedek, Cupertino, CA (US)

(73) Assignee: Applied Materials, Santa Clara, CA (US)

( * ) Notice: Subject to any disclaimer, the term of this patent is extended or adjusted under 35 U.S.C. 154(b) by 0 days.

(21) Appl. No.: 10/920,701

(22) Filed: Aug. 17, 2004

Related U.S. Application Data (60) Provisional application No. 60/496,312, filed on Aug. 18, 2003.

(51) Int. Cl.
*B24B 49/00* (2006.01)
(52) U.S. Cl. ............... 451/5; 451/6; 451/8; 451/10; 451/11; 451/41; 451/286; 451/287; 451/288
(58) Field of Classification Search ............... 451/5, 451/6, 8, 10, 11, 41, 286, 287, 288
See application file for complete search history.

(56) References Cited

U.S. PATENT DOCUMENTS

| | | | |
|---|---|---|---|
| 5,081,796 A | | 1/1992 | Schultz |
| 5,486,129 A | | 1/1996 | Sandhu et al. |
| 5,658,183 A | | 8/1997 | Sandhu et al. |
| 5,730,642 A | | 3/1998 | Sandhu et al. |
| 5,731,697 A | * | 3/1998 | Li et al. ............... 324/71.5 |
| 5,738,574 A | | 4/1998 | Tolles et al. |
| 5,840,614 A | | 11/1998 | Sim et al. |
| 5,964,653 A | | 10/1999 | Perlov et al. |
| 5,985,094 A | | 11/1999 | Mosca |
| 6,159,073 A | | 12/2000 | Wiswesser et al. |
| 6,252,239 B1 | * | 6/2001 | Goruganthu et al. ... 250/559.27 |
| 6,280,289 B1 | | 8/2001 | Wiswesser et al. |
| 6,399,501 B1 | | 6/2002 | Birang et al. |
| 6,422,927 B1 | | 7/2002 | Zuniga |

(Continued)

FOREIGN PATENT DOCUMENTS

DE       3801969 A     7/1989

(Continued)

OTHER PUBLICATIONS

Bennett et al., U.S. Appl. No. 10/396,299, filed Mar. 23, 2003, 30 pp.

*Primary Examiner*—Lee D. Wilson
*Assistant Examiner*—Shantese L. McDonald
(74) *Attorney, Agent, or Firm*—Fish & Richardson (57) ABSTRACT

A system, method, and computer program product for chemical mechanical polishing a substrate in which initially a plurality of predetermined pressures are applied to a plurality of regions of the substrate. A plurality of portions of the substrate are monitored during polishing with an in-situ monitoring system. If the difference in thickness between two portions of the substrate exceeds a predetermined threshold, a plurality of adjusted pressures are calculated in a closed-loop control system, and the plurality of adjusted pressures are applied to the plurality of regions of the substrate. The predetermined threshold includes an initial threshold for the start of the polishing process and a second threshold for a period of polishing after the start of the polishing process.

24 Claims, 7 Drawing Sheets

U.S. PATENT DOCUMENTS

| | | |
|---|---|---|
| 6,450,868 B1 | 9/2002 | Zuniga et al. |
| 6,494,765 B1 | 12/2002 | Gitis et al. |
| 6,572,441 B1 | 6/2003 | Lukner et al. |
| 6,602,724 B1 * | 8/2003 | Redeker et al. ............... 438/5 |
| 6,609,946 B1 | 8/2003 | Tran |
| 6,609,947 B1 | 8/2003 | Moore |
| 6,669,539 B1 | 12/2003 | Amartur |
| 6,766,215 B1 | 7/2004 | Lensing et al. |
| 6,776,692 B1 * | 8/2004 | Zuniga et al. ............... 451/41 |
| 6,801,326 B1 * | 10/2004 | Finarov et al. ............ 356/630 |
| 6,806,098 B1 | 10/2004 | Ohtake et al. |
| 6,857,945 B1 | 2/2005 | Chen et al. |
| 2001/0000773 A1 | 5/2001 | Campbell et al. |
| 2002/0098777 A1 | 7/2002 | Laursen et al. |
| 2002/0164925 A1 | 11/2002 | Swedek et al. |
| 2003/0199112 A1 | 10/2003 | Shanmugasundram et al. |
| 2005/0024047 A1 | 2/2005 | Miller et al. |

FOREIGN PATENT DOCUMENTS

| | | |
|---|---|---|
| EP | 0904895 A | 3/1999 |
| EP | 1066925 | 1/2001 |

* cited by examiner

CHEMICAL MECHANICAL POLISHING CONTROL SYSTEM AND METHOD

CROSS-REFERENCE TO RELATED APPLICATION

The present application claims priority to U.S. Provisional Patent Application No. 60/496,312, filed on Aug. 18, 2003, which is incorporated herein by reference in its entirety.

BACKGROUND

The present invention relates generally to chemical mechanical polishing of substrates, and more particularly to methods and apparatus for controlling a chemical mechanical polishing system.

An integrated circuit is typically formed on a substrate by the sequential deposition of conductive, semiconductive or insulative layers on a silicon wafer. One fabrication step involves depositing a filler layer over a non-planar surface, and planarizing the filler layer until the non-planar surface is exposed. For example, a conductive filler layer can be deposited on a patterned insulative layer to fill the trenches or holes in the insulative layer. The filler layer is then polished until the raised pattern of the insulative layer is exposed. After planarization, the portions of the conductive layer remaining between the raised pattern of the insulative layer form vias, plugs and lines that provide conductive paths between thin film circuits on the substrate. In addition, planarization is needed to planarize the substrate surface for photolithography.

Chemical mechanical polishing (CMP) is one accepted method of planarization. This planarization method typically requires that the substrate be mounted on a carrier or polishing head. The exposed surface of the substrate is placed against a rotating polishing disk pad or belt pad. The polishing pad can be either a "standard" pad or a fixed-abrasive pad. A standard pad has a durable roughened surface, whereas a fixed-abrasive pad has abrasive particles held in a containment media. The carrier head provides a controllable load on the substrate to push it against the polishing pad. A polishing slurry, including at least one chemically-reactive agent, and abrasive particles if a standard pad is used, is supplied to the surface of the polishing pad.

One problem in CMP is determining whether the polishing process is complete, i.e., whether a substrate layer has been planarized to a desired flatness or thickness, or when a desired amount of material has been removed. Overpolishing (removing too much) of a conductive layer or film leads to increased circuit resistance. On the other hand, underpolishing (removing too little) of a conductive layer leads to electrical shorting. Variations in the initial thickness of the substrate layer, the slurry composition, the polishing pad condition, the relative speed between the polishing pad and the substrate, and the load on the substrate can cause variations in the material removal rate. These variations cause variations in the time needed to reach the polishing endpoint. Therefore, the polishing endpoint cannot be determined merely as a function of polishing time.

One way to determine the polishing endpoint is to remove the substrate from the polishing surface and examine it. For example, the substrate can be transferred to a metrology station where the thickness of a substrate layer is measured, e.g., with a profilometer or a resistivity measurement. If the desired specifications are not met, the substrate is reloaded into the CMP apparatus for further processing. This is a time-consuming procedure that reduces the throughput of the CMP apparatus. Alternatively, the examination might reveal that an excessive amount of material has been removed, rendering the substrate unusable.

More recently, in-situ monitoring of the substrate has been performed, e.g., with optical or capacitance sensors, in order to detect the polishing endpoint. Other proposed endpoint detection techniques have involved measurements of friction, motor current, slurry chemistry, acoustics and conductivity. One detection technique that has been considered is to induce an eddy current in the metal layer and measure the change in the eddy current as the metal layer is removed.

Another reoccurring problem in CMP is that polishing rates may vary across the substrate as the substrate is being polished. Thus, it is desirable to use data from the in-situ monitoring system to adjust the polishing parameters (such as the pressure applied to different portions of the substrate) to ensure that the substrate is polished to a uniform flatness.

SUMMARY

In one aspect, the invention is directed to a method of chemical mechanical polishing a substrate having a layer. In the method, the substrate is polished, and a plurality of predetermined pressures are applied to a plurality of regions of the substrate. A plurality of portions of the substrate are monitored during polishing with an in-situ monitoring system. A plurality of thicknesses of the layer are determined using data from the in-situ monitoring system. The plurality of thicknesses include a first thickness of the layer in a first portion of the substrate and a second thickness of the layer in a second portion of the substrate. A determination is made as to whether a difference between the first thickness and the second thickness is outside a predetermined threshold, where the predetermined threshold includes an initial threshold for a start of the polishing process and a second threshold for a period of polishing after the start of the polishing process. If the difference between the first thickness and the second thickness is outside the threshold, a plurality of adjusted pressures are calculated in a closed-loop control system, and the plurality of adjusted pressures are applied to the plurality of regions of the substrate.

Implementations of the invention may include one or more of the following features. The system may continue to determine the plurality of thicknesses and recalculate the plurality of adjusted pressures continuously or periodically in the closed-loop control system. The system may continue to determine whether a difference between the first thickness and the second thickness is outside the predetermined threshold. The step of recalculating may halt if the difference between the first thickness and the second thickness returns to a value within the threshold. A most recently calculated plurality of adjusted pressures may be applied to the plurality of regions of the substrate. The second threshold may be narrower than the first threshold. The predetermined threshold may be a function, e.g., a step function, of at least one of the plurality of thicknesses or a function of time. A ratio between the initial threshold and the second threshold may be between about 2:1 and 10:1. The predetermined threshold may include an upper limit and a lower limit, and an absolute value of the upper limit may be different than an absolute value of the lower limit. The first portion and the second portion may correspond to a first region and a second region from the plurality of regions. The plurality of regions of the substrate may comprise concentric regions, e.g., an inner region, a middle region and an outer region. The first region may be the inner region, and the second region may be the middle region or the outer region. Calculating the plurality of adjusted pressures in the closed-loop control system may include calculating a plurality of adjusted pressures to achieve a target thickness profile. The in-situ monitoring system may be an eddy current monitoring system, and the layer may be a metal. The in-situ monitoring system may be an optical monitoring system, and the layer may be a dielectric.

The invention also includes computer program products and polishing systems that carry out these methods.

Possible advantages of implementations of the invention can include one or more of the following. During bulk polishing of the metal layer, preselected pressures can be applied to different regions of the substrate in order to compensate for non-uniform polishing rates and non-uniform thickness of the incoming substrate. By avoiding unnecessary modifications to the polishing process parameters, the risk of unexpected polishing results is reduced. In addition, by using larger error thresholds at the beginning of the polishing process, there is time for the polishing process to stabilize and for the copper polishing process to initiate. Thus, the closed loop system is not activated while the behavior of the polishing system is chaotic. However, once the process has had time to stabilize, should the polishing process deviate from the expected, the pressure profile applied by the carrier head can be adjusted to ensure that the substrate is planarized to a desired flatness uniformity.

Other features and advantages of the invention will become apparent from the following description, including the drawings and claims.

DETAILED DESCRIPTION

Figure 1:
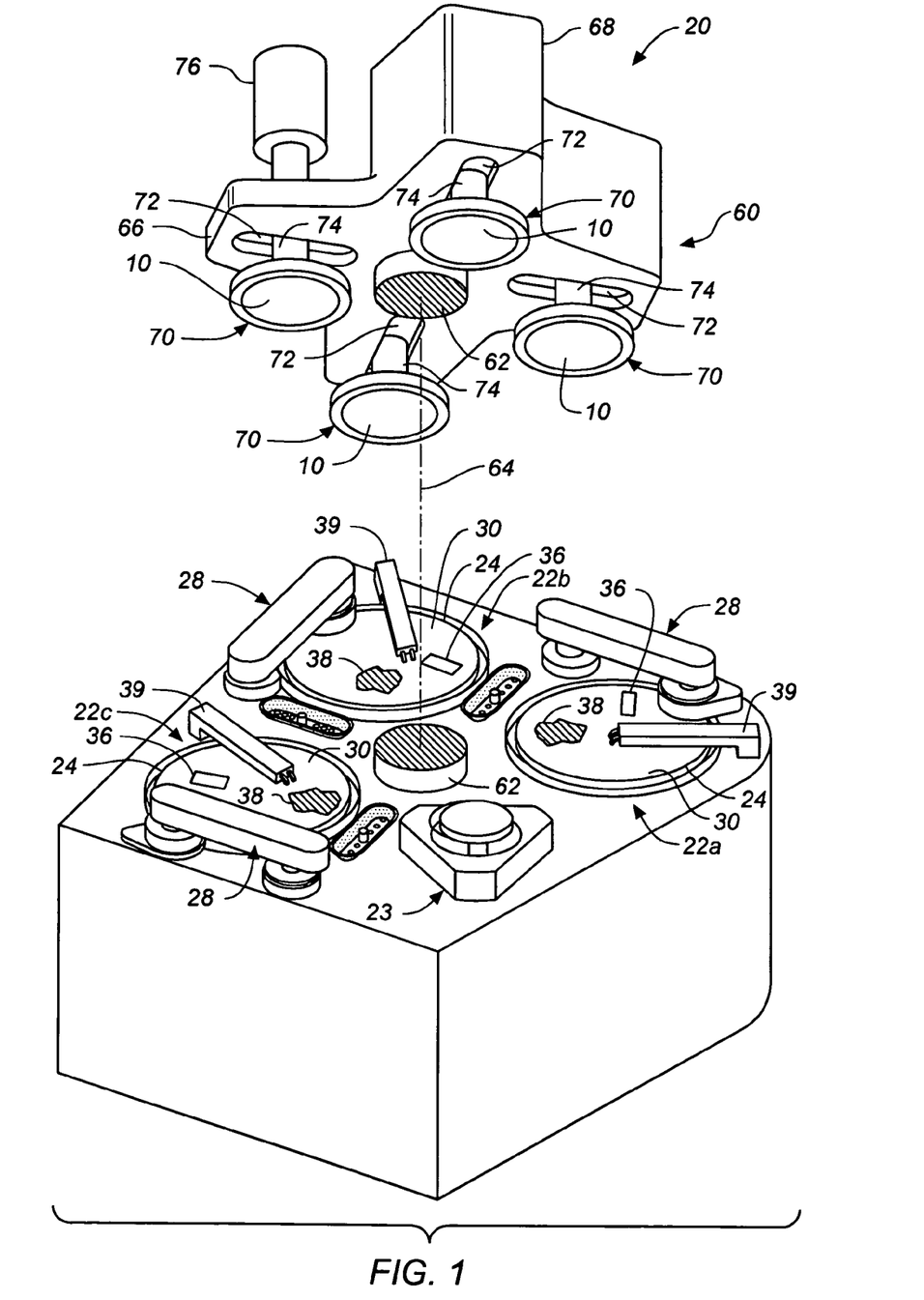
FIG. 1 is a schematic exploded perspective view of a chemical mechanical polishing apparatus.

Referring to FIG. 1, one or more substrates 10 can be polished by a CMP apparatus 20. A description of a similar polishing apparatus 20 can be found in U.S. Pat. No. 5,738,574, the entire disclosure of which is incorporated herein by reference. Polishing apparatus 20 includes a series of polishing stations 22a, 22b and 22c, and a transfer station 23. The transfer station 23 transfers the substrates between the carrier heads and a loading apparatus.

Each polishing station includes a rotatable platen 24 on which is placed a polishing pad 30. The first and second polishing stations 22a and 22b can include a two-layer polishing pad with a hard durable outer surface or a fixed-abrasive pad with embedded abrasive particles. The final polishing station 22c can include a relatively soft pad or a two-layer pad. Each polishing station can also include a pad conditioner apparatus 28 to maintain the condition of the polishing pad so that it will effectively polish substrates.

Figure 2:
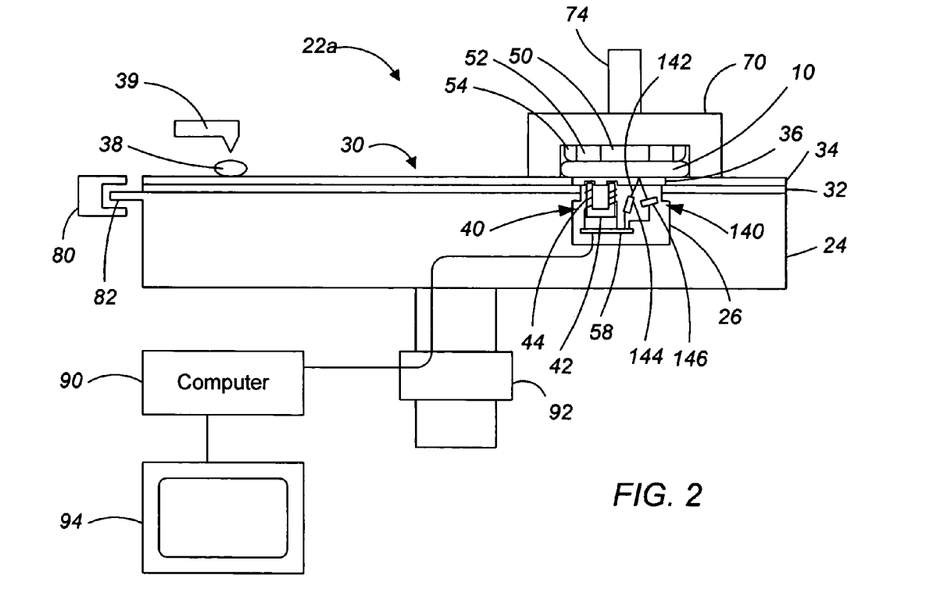
FIG. 2 is a schematic side view, partially cross-sectional, of a chemical mechanical polishing station that includes an eddy current monitoring system and an optical monitoring system.

Referring to FIG. 2, a two-layer polishing pad 30 typically has a backing layer 32 which abuts the surface of the platen 24 and a covering layer 34 which is used to polish the substrate 10. The covering layer 34 is typically harder than the backing layer 32. However, some pads have only a covering layer and no backing layer. The covering layer 34 can be composed of foamed or cast polyurethane, possibly with fillers, e.g., hollow microspheres, and/or a grooved surface. The backing layer 32 can be composed of compressed felt fibers leached with urethane. A two-layer polishing pad, with the covering layer composed of IC-1000 and the backing layer composed of SUBA-4, is available from Rodel, Inc., of Newark, Del. (IC-1000 and SUBA-4 are product names of Rodel, Inc.).

During a polishing step, a polishing liquid 38, such as an abrasive slurry or abrasive-free solution can be supplied to the surface of the polishing pad 30 by a slurry supply port or combined slurry/rinse arm 39. The same slurry solution may be used at the first and second polishing stations 22a and 22b, whereas another slurry solution may be used at the final polishing station 22c.

Returning to FIG. 1, a rotatable multi-head carousel 60 supports four carrier heads 70. The carousel is rotated by a central post 62 about a carousel axis 64 by a carousel motor assembly (not shown) to orbit the carrier head systems and the substrates attached thereto between the polishing stations 22a–22c and the transfer station 23. Three of the carrier head systems receive and hold substrates and polish them by pressing them against the polishing pads. Meanwhile, one of the carrier head systems delivers a polished substrate to the transfer station 23 and receives an unpolished substrate from the transfer station 23.

Each carrier head 70 is connected by a carrier drive shaft 74 to a carrier head rotation motor 76 (shown by the removal of one quarter of cover 68) so that each carrier head can independently rotate about its own axis. In addition, each carrier head 70 independently laterally oscillates in a radial slot 72 formed in carousel support plate 66. In operation, the platen is rotated about its central axis, and the carrier head is rotated about its central axis and translated laterally across the surface of the polishing pad.

Figure 3:
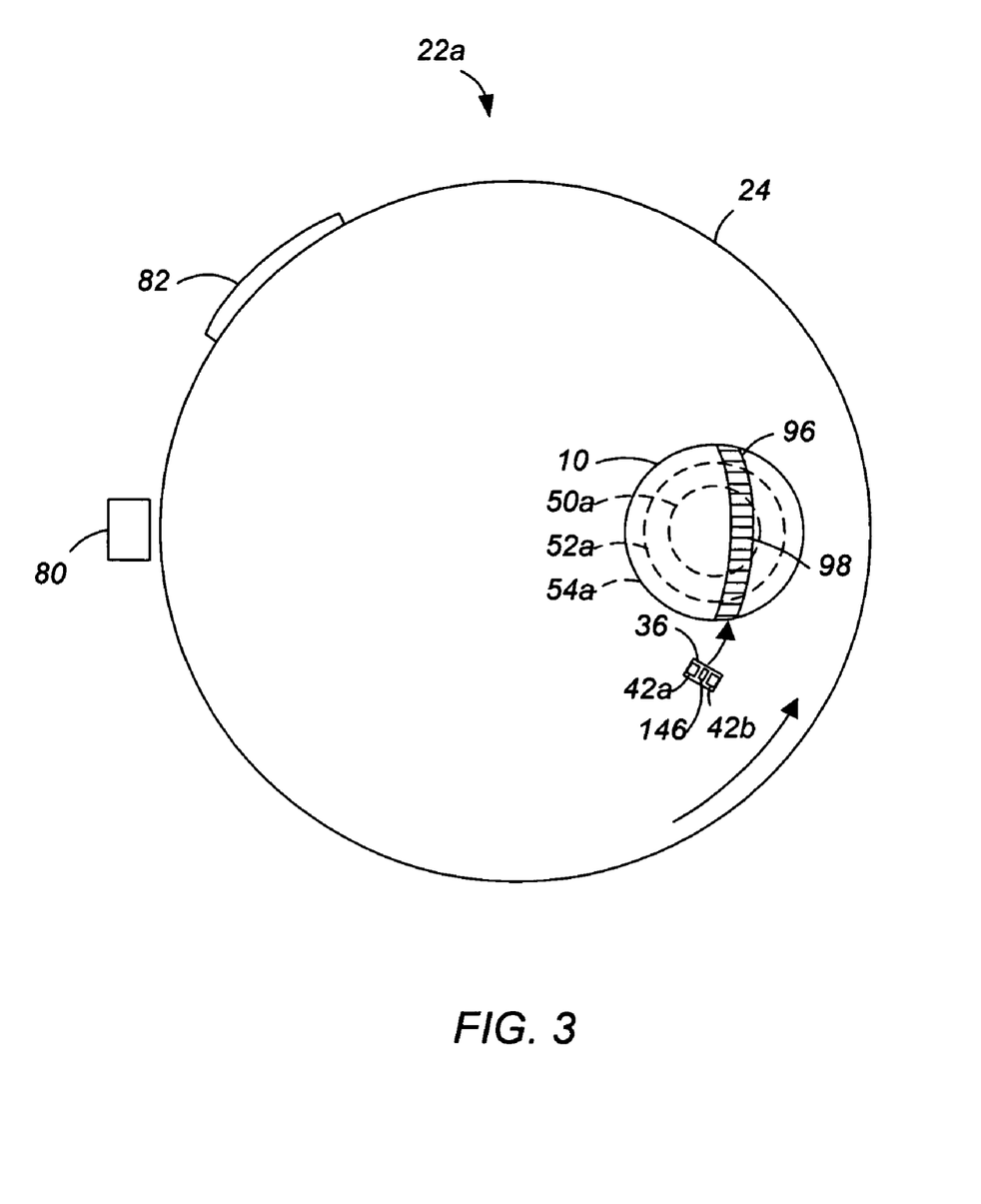
FIG. 3 is a schematic top view of a platen from the polishing station of FIG. 2.

Descriptions of a suitable carrier head 70 can be found in U.S. Pat. No. 6,422,927, and in U.S. patent application Ser. No. 09/712,389, filed Nov. 13, 2000, the entire disclosures of which are incorporated by reference. Referring to FIGS. 2 and 3, the carrier head 70 can independently apply different pressures to different radial zones of the substrate 10. For example, the carrier head 70 may include a flexible membrane with a substrate receiving surface and three independently pressurizable concentric chambers 50, 52 and 54 behind the membrane. Thus, the inner circular chamber 50 will apply a pressure to an inner circular region 50a of the substrate 10, the middle annular chamber 52 will apply a pressure to a middle annular region 52a of the substrate 10, and the outer annular chamber 54 will apply a pressure to an outer annular region 54a of the substrate 10.

Referring again to FIG. 2, a recess 26 is formed in the platen 24, and a transparent section 36 is formed in the polishing pad 30 overlying the recess 26. The transparent section 36 is positioned such that it passes beneath the substrate 10 during a portion of the platen's rotation, regardless of the translational position of the carrier head 70. Assuming that the polishing pad 30 is a two-layer pad, the transparent section 36 can be constructed by cutting an aperture in the backing layer 32, and by replacing a section of the cover layer 34 with a transparent plug. The plug can be a relatively pure polymer or polyurethane, e.g., formed without fillers. In general, the material of the transparent section 36 should be non-magnetic and non-conductive.

At least one of the polishing stations, e.g., the first polishing station 22a or the second polishing station 22b, includes an in-situ eddy current monitoring system 40 and an optical monitoring system 140. The eddy current monitoring system 40 and optical monitoring system 140 can function as a polishing process control and endpoint detection system. The first polishing station 22a can include just an eddy current monitoring system 40, and the final polishing station 22c can include just an optical monitoring system 140, although either may include both monitoring systems, only an eddy current monitoring system, or only an optical monitoring system.

As shown by FIG. 3, the sensor assembly of the monitoring system is embedded in the platen 24 and sweeps beneath the substrate 10 with each rotation of the platen 24. Each time the sensor assembly sweeps beneath the substrate 10, data can be collected from the eddy current monitoring system 40 and optical monitoring system 140. Specifically, as the sensor assemblies sweep in a path 96 across the substrate 10, the monitoring systems will make a series of measurements, e.g., at measurement points 98. Each measurement point 98 can be associated with a radial position on the substrate, as described in U.S. Pat. Nos. 6,159,073 and 6,280,289, the entire disclosures of which are incorporated herein by references, for endpoint or process control. Measurements can be taken more frequently than shown by measurement points 98 in FIG. 3. The number of measurement points 98 shown in FIG. 3 has been limited for clarity.

Returning to FIG. 2, the eddy current monitoring system 40 induces and senses eddy currents in a metal layer on the substrate 10. The sensor assembly for the eddy current monitoring system 40 includes a core 42 positioned in the recess 26 to rotate with the platen, and a coil 44 wound around the core 42. The coil 44 is connected to a control system, some components of which can be located on a printed circuit board 58 inside the recess 26. A suitable control system is described in U.S. patent application Ser. No. 10/633,276, filed Jul. 31, 2003, by G. Laurie Miller et al., entitled "Eddy Current System for In-Situ Profile Measurement," the entire disclosure of which is incorporated herein by reference. A computer 90 can be coupled to the components in the platen, including the printed circuit board 58, through a rotary electrical union 92.

Figure 4:
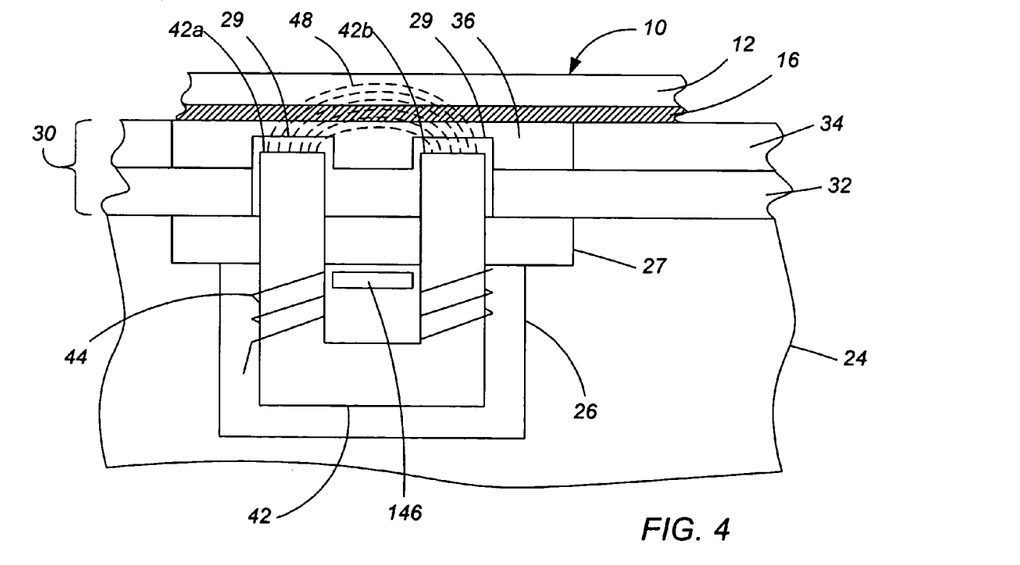
FIG. 4 is a schematic cross-sectional view illustrating a magnetic field generated by the eddy current monitoring system.

Referring to FIG. 4, the core 42 can be a U-shaped body formed of a non-conductive material with a relatively high magnetic permeability. The exact winding configuration, core composition and shape, and an associated capacitor size can be determined experimentally. As shown, the lower surface of the transparent section 36 may include indentations 29, and the two prongs 42a and 42b of the core 42 may extend into the indentations so as to be positioned closer to the substrate 10. The system can also include a transparent cover 27 e.g., of glass or a hard plastic, over the recess 26. The top surface of the transparent cover 27 can be flush with the top surface of the platen 24. In one implementation, the core 42 only extends into the transparent cover 27 and not into the polishing pad 30.

In operation, an oscillator in a controller drives the coil 44 to generate an oscillating magnetic field 48 that extends through the body of the core 42 and into the gap between the two poles 42a and 42b of the core 42. At least a portion of the oscillating magnetic field 48 extends through the polishing pad 30 and into the substrate 10. If a conductive layer 16, e.g., a metal such as copper, is present on the substrate 10, the oscillating magnetic field 48 generates eddy currents in the conductive layer 16. The eddy currents cause the conductive layer 16 to act as an impedance source that is coupled to sense circuitry in the controller and to coil 44. As the thickness of the conductive layer 16 changes, the impedance changes. By detecting this change, the sense circuitry can sense the change in the strength of the eddy currents, and thus the change in thickness of the conductive layer 16.

Figure 5A:
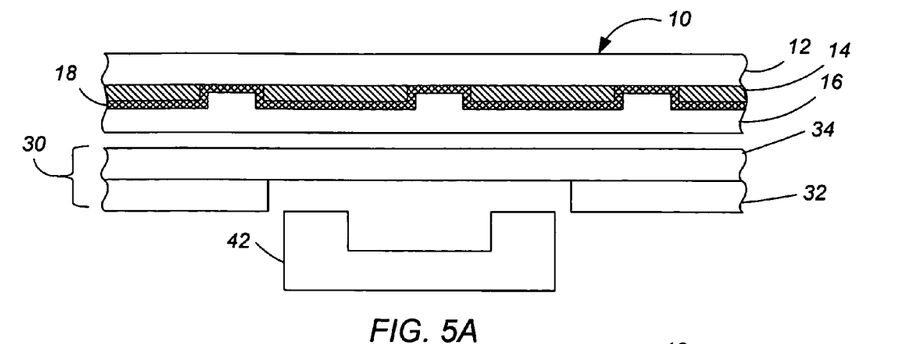
FIGS. 5A–5D schematically illustrate a method of detecting a polishing endpoint.
Figure 5B:
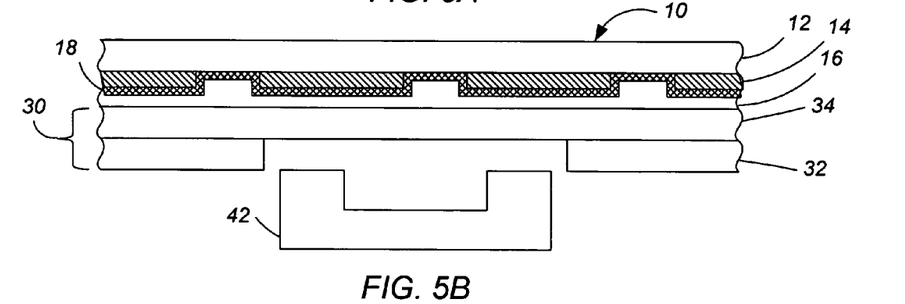

As shown in FIGS. 5A and 5B, for a polishing operation, the substrate 10 is placed in contact with the polishing pad 30. The substrate 10 can include a silicon wafer 12 and the conductive layer 16 disposed over one or more patterned underlying layers 14, which can be semiconductor, conductor and/or insulator layers. A barrier layer 18, such as tantalum or tantalum nitride, may separate the conductive layer 16 from the patterned underlying layers 14.

After polishing, the conductive layer 16 will provide metal features, e.g., vias, pads and interconnects. However, prior to polishing, the bulk of conductive layer 16 is relatively thick and continuous and has a low resistivity, and relatively strong eddy currents can be generated in the conductive layer 16. As previously mentioned, the eddy currents cause the conductive layer 16 to function as an impedance source in parallel with the coil 44.

Referring to FIG. 5B, as the substrate 10 is polished, the bulk portion of the conductive layer 16 is thinned. As the conductive layer 16 thins, its sheet resistivity increases, and the eddy currents in the metal layer become dampened. Consequently, the coupling between conductive layer 16 and the sense circuitry is reduced (i.e., increasing the resistivity of the virtual impedance source).

Figure 5C:
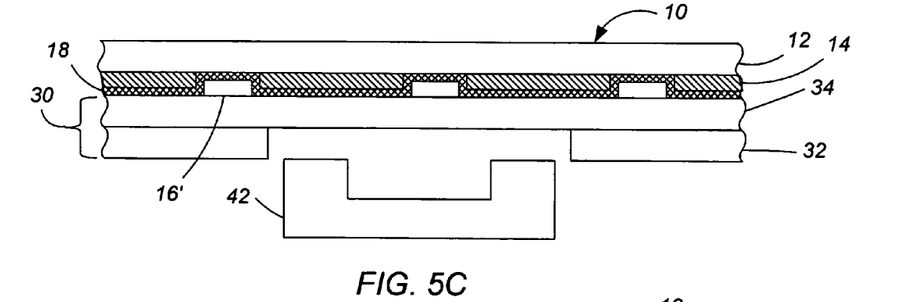

Referring to FIG. 5C, eventually the bulk portion of the conductive layer 16 is removed, exposing the barrier layer 18 and leaving conductive interconnects 16' in the trenches between the underlying patterned layers 14. At this point, the coupling between the conductive portions in the substrate, which are generally small and generally non-continuous, and the sense circuitry reaches a minimum.

Figure 5D:
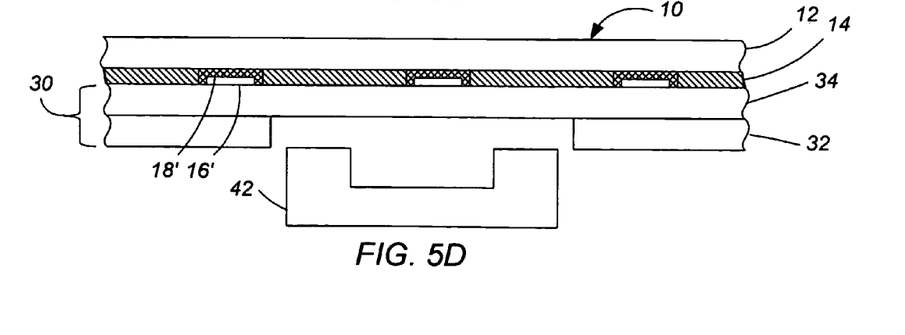

Referring to FIG. 5D, continued polishing removes the barrier layer 18 and exposes the underlying patterned layers 14, leaving conductive interconnects 16' and buried barrier layer films 18' in the trenches between the underlying patterned layers 14.

Returning to FIG. 2, the optical monitoring system 140, which can function as a reflectometer or interferometer, can be secured to the platen 24 in the recess 26 adjacent the eddy current monitoring system 40. Thus, the optical monitoring system 140 can measure the reflectivity of substantially the same location on the substrate 10 as is being monitored by the eddy current monitoring system 40. Specifically, the optical monitoring system 140 can be positioned to measure a portion of the substrate 10 at the same radial distance from the axis of rotation of the platen 24 as the eddy current monitoring system 40. Thus, the optical monitoring system 140 can sweep across the substrate in the same path as the eddy current monitoring system 40.

The optical monitoring system 140 includes a light source 144 and a detector 146. The light source generates a light beam 142 which propagates through the transparent section 36 and the slurry to impinge upon the exposed surface of the substrate 10. For example, the light source 144 may be a laser and the light beam 142 may be a collimated laser beam. The light beam 142 can be projected from the light source 144 at an angle $\alpha$ from an axis normal to the surface of the substrate 10. The light source 144 can be configured so that the light beam 142 impinges upon a point at the center of the region on the substrate 10 monitored by the eddy current monitoring system 40. In addition, if the recess 26 and the transparent section 36 are elongated, a beam expander (not illustrated) may be positioned in the path of the light beam 142 to expand the light beam 142 along the elongated axis of the transparent section 36.

Referring to FIGS. 2 and 3, the polishing station 22a can also include a position sensor 80, such as an optical interrupter, to sense when the core 42 and the light source 144 are beneath the substrate 10. For example, the position sensor 80 could be mounted at a fixed point opposite carrier head 70. A flag 82 is attached to the periphery of the platen 24. The point of attachment and length of the flag 82 is selected so that it interrupts the optical signal of the position sensor 80 while the transparent section 36 sweeps beneath the substrate 10. Alternately, the polishing station 22a can include an encoder to determine the angular position of platen 24.

A general purpose programmable digital computer 90 receives signals from the eddy current monitoring system 40 and the optical monitoring system 140. Since the sensor assembly sweeps beneath the substrate 10 with each rotation of the platen 24, information on the conductive layer thickness and exposure of the underlying layer is accumulated in-situ and on a continuous real-time basis (once per platen rotation). The computer 90 can be programmed to sample measurements from the monitoring systems when the substrate 10 generally overlies the transparent section 36 (e.g., as determined by the position sensor 80). As polishing progresses, the reflectivity or thickness of the conductive layer 16 changes, and the sampled signals vary with time. The time varying sampled signals may be referred to as traces. The measurements from the monitoring systems can be displayed on an output device 94 during polishing to permit an operator of the device to visually monitor the progress of the polishing operation. In addition, as discussed below, the traces may be used to control the polishing process and determine the end-point of the metal layer polishing operation.

In operation, the polishing station 22a uses the eddy current monitoring system 40 and optical monitoring system 140 to determine when the bulk of the conductive layer 16 (see FIGS. 5A–5D) has been removed and to determine when the underlying barrier layer 18 has been substantially exposed. The computer 90 applies process control and endpoint detection logic to the sampled signals to determine when to change process parameters and to detect the polishing endpoint. Possible process control and endpoint criteria for the detector logic include local minima or maxima, changes in slope, threshold values in amplitude or slope, or combinations thereof.

In addition, the computer 90 can be programmed to divide the measurements from both the eddy current monitoring system 40 and the optical monitoring system 140 from each sweep beneath the substrate 10 into a plurality of measurement points 98. The computer 90 can calculate the radial position on the substrate 10 for each measurement point, can sort the measurements into radial ranges, to determine minimum, maximum, and average measurements for each radial range, and can use multiple radial ranges to determine the polishing endpoint, as discussed in U.S. Pat. No. 6,399,501, the entirety of which is incorporated herein by reference. In one implementation, the computer 90 averages measurements (e.g., measurements corresponding to the radial ranges) over time during multiple sweeps beneath the substrate 10. A user can specify over how many sweeps the measurements should be averaged (e.g., 5). A rolling average weighted by time can be used, so that more recent measurements are weighted more heavily than older measurements.

The computer 90 may also be connected to the pressure mechanisms that control the pressure applied by the carrier head 70, to the carrier head rotation motor 76 (see FIG. 1) to control the carrier head rotation rate, to the platen rotation motor (not shown) to control the platen rotation rate, or to the slurry distribution system 39 to control the slurry composition supplied to the polishing pad 30. Specifically, after sorting the measurements into radial ranges, information on the conductive layer thickness can be fed in real-time into a closed-loop controller to periodically or continuously modify the polishing pressure profile applied by the carrier head 70, as discussed in U.S. patent application Ser. No. 09/609,426, filed Jul. 5, 2000, the entirety of which is incorporated herein by reference. For example, the computer 90 could determine that the endpoint criteria have been satisfied for the outer radial ranges but not for the inner radial ranges. This would indicate that the underlying patterned layers 14 have been exposed in the outer annular region 54a but not in the inner circular region 50a of the substrate 10. In this case, the computer 90 could reduce the pressure applied to an outer area of the substrate 10. In one implementation, a user specifies how frequently the polishing pressure profile can be modified (e.g., to be a multiple of the rotation rate of platen 24, such as sixty times per minute).

Figure 6:
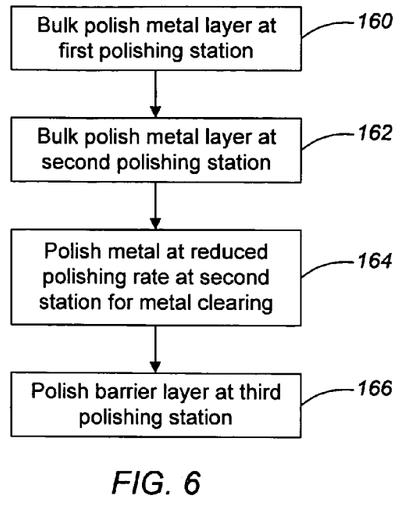
FIG. 6 is a flowchart illustrating a method of polishing a metal layer.

A method of polishing a metal layer, such as a copper layer, is shown in flowchart form in FIG. 6. First, a substrate 10 is polished at the first polishing station 22a (see FIG. 1) to remove the bulk of the metal layer (step 160). When a predetermined thickness, e.g., 2000 to 4000 Angstroms (Å), of the copper layer remains over an underlying barrier layer, as determined using data from the eddy current monitoring system 40, the polishing process is halted and the substrate 10 is transferred to the second polishing station 22b. At the second polishing station 22b, the substrate 10 is initially polished at a high polishing rate (step 162). However, when the metal layer in a particular region of the substrate 10 is near clearing or is becoming cleared, as determined using data from the eddy current or optical monitoring system, the polishing parameters are modified to reduce the polishing rate for at least that particular region (step 164), e.g., by reducing the pressure on the particular region. Once the metal layer has been removed at the second polishing station 22b, as determined using data from the optical monitoring system 140, the substrate is transferred to the third polishing station 22c for removal of the barrier layer (step 166).

In an alternative method, all of the polishing of the metal layer is performed at the first polishing station 22a. Removal of the barrier layer is performed at the second polishing station 22b, and a buffing step is performed at the final polishing station 22c.

During the bulk polishing steps at the first and second polishing stations 22a and 22b, the polishing process can be monitored by the eddy current monitoring system 40. As polishing progresses, the radial thickness information from the eddy current monitoring system 40 can be fed into a closed-loop feedback system to control the pressure on different regions of the substrate (or to control the size of the loading area). The closed-loop control system calculates pressures to apply to the different regions of the substrate. This permits the carrier head to compensate for the non-uniformity in the polishing rate or for non-uniformity in the thickness of the metal layer of the incoming substrate. The closed-loop control system may be configured to accept user input setting maximum and minimum pressures that will be output to control the polisher. These minimum and maximum pressures can be based on physical limitations of the carrier head. In the event that the closed-loop control system calculates a desired pressure outside the range, it instead outputs a pressure at the edge of the permitted range. The pressure of the retaining ring on the polishing pad may also be adjusted to adjust the polishing rate. In one implementation, the pressure applied to the retaining ring chamber is varied as a function of the pressures applied to the substrate in order to keep the pressure of the retaining ring on the polishing pad substantially constant. For example, the pressure applied to the retaining ring chamber can be a fixed amount greater than the pressure applied to the substrate. As more pressure is applied to the substrate, the retaining ring may tend to lift away from the polishing pad for certain carrier head designs. Increasing the pressure applied to the retaining ring chamber can keep the pressure of the retaining ring on the polishing pad constant. The closed-loop feedback system need only be activated when differences in thickness across the substrate exceed a threshold.

Figure 7:
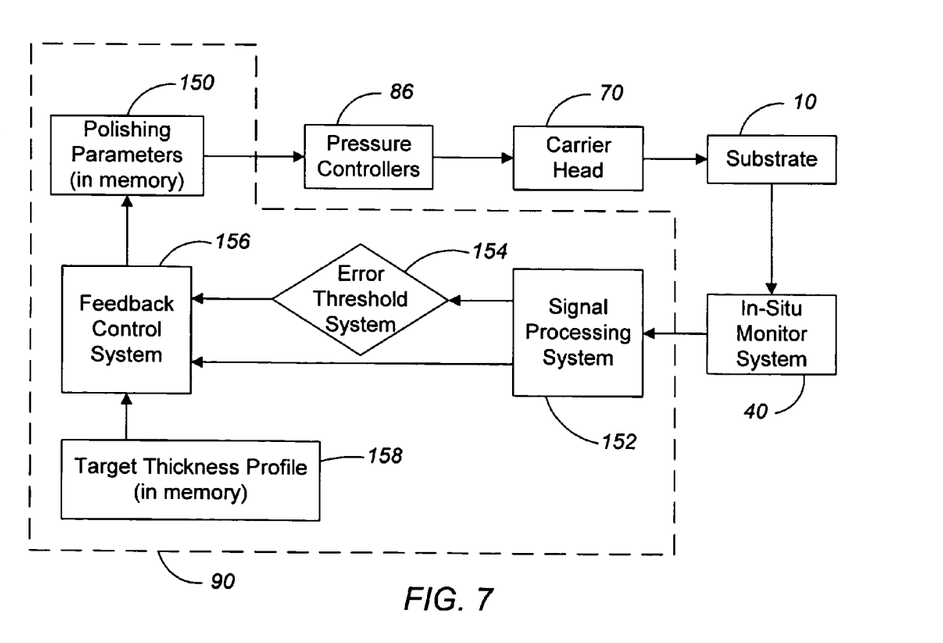
FIG. 7 is a block diagram of a feedback system for controlling the pressure on a substrate during polishing.

The polishing system using the closed-loop feedback system is illustrated as a block diagram in FIG. 7. The polishing parameters 150 that control the polishing system are stored in a memory. The polishing parameters of particular interest include the individual chamber pressures. The chamber pressures will determine the pressures on the different regions 50a–50c on the substrate. Initially, the polishing pressures are preset (e.g., default settings) values determined experimentally or theoretically to provide a target thickness profile. Other parameters include platen and carrier head rotation rates, retaining ring pressure, and slurry flow rate.

The polishing parameters 150 stored in memory are fed to pressure controllers 86, such as pressure regulators, that control the pressure in the chambers of the carrier head 70. The carrier head loads the substrate 10 against the polishing pad. Both the platen and carrier head 70 rotate to create relative motion between the polishing pad and substrate 10, resulting in polishing.

During polishing, the in-situ eddy current monitoring system 40 monitors the metal layer on the substrate 10 and generates a signal that is passed to a signal processing system 152. The signal processing system 152 sorts the measurements from the in-situ eddy current monitoring system 40 into radial regions and calculates a metal layer thickness profile, i.e., the metal layer thickness as a function of radial position on the substrate. In other words, the layer thickness is calculated at multiple positions from the substrate center to the substrate edge. The calculated layer thicknesses may represent, for example, an average thickness for each of a plurality of radial concentric portions of the substrate. These concentric portions can correspond to the regions 50a–54a of the substrate 10 corresponding to the independently controllable chambers 50–54 in the carrier head 70 (see FIGS. 2 and 3).

The metal layer thicknesses are passed to an error threshold system 154 which is configured to determine whether the difference in thickness between the various regions on the substrate exceed a predetermined threshold. In one implementation, the error threshold system 154 calculates a thickness difference for various pairs of the regions 50a–54a of the substrate. Specifically, the error threshold system 154 can calculate a thickness difference between the inner region 50a and the middle region 52a, and between the inner region 50a and the outer region 54a. Each pair of regions can have its own error threshold.

If the thickness difference exceeds the predetermined threshold, then the error threshold system 154 activates the closed-loop feedback control system 156. The feedback control system 156 receives the metal layer thickness profile and a target thickness profile 158 that is stored in memory. In response to the metal thickness profile (and possibly other sensor measurements and/or the machine history), the feedback control system 156 calculates adjusted pressures for the carrier head 70. For example, if the substrate edge is being polished faster than the substrate center, then the pressure applied by the carrier head to the edge of the substrate can be reduced. In one implementation, the pressure applied to the inner circular chamber 50 of carrier head 70 is fixed and only the pressures applied to the middle annular chamber 52 and the outer annular chamber 54 are varied. The feedback control system 156 can modify the stored polishing parameters 150 to match the calculated pressures. If the thickness difference falls below the threshold, then the system returns to the open-loop control using the last values calculated by the feedback control system 156.

Although the signal processing system 152, error threshold system 154 and feedback control system 156 are illustrated as separate components, some or all of the components can part of a single controller, such as the computer 90. Such a controller can include one or more general purpose or special purpose processors to perform the functions of the systems 152–156, and instructions for causing the controller to perform these functions can be stored on a computer-readable medium.

Figure 8:
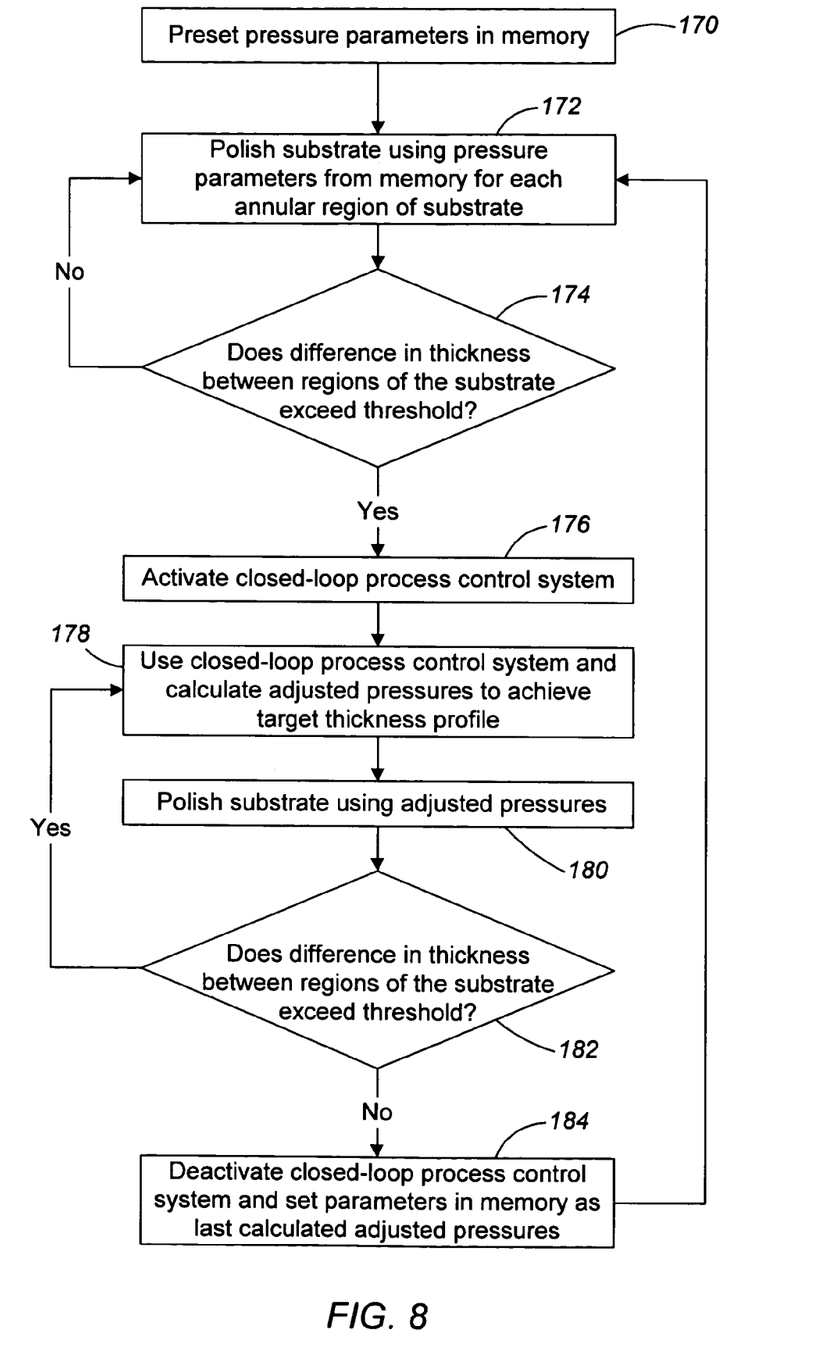
FIG. 8 is a flowchart illustrating a method of controlling the pressure on a substrate during polishing.

Referring to FIG. 8, the process performed by the polishing system begins by setting the polishing parameters, including the pressure values, to experimentally or theoretically determined preset values that should provide a target thickness profile (step 170). There can be a different pressure for each independently controllable chamber 50–54 of the carrier head. The substrate is polished using these preset pressures from the system memory (step 172).

As polishing progresses, the error threshold system monitors the thickness differences between the various portions of the substrate. As described above, these portions of the substrate can be the regions 50a–54a that correspond to the independently controllable chambers 50–54 of the carrier head. If one or more of the thickness differences exceed a predetermined threshold (step 174), the error threshold system activates the feedback control system (step 176). The predetermined threshold may be in the range of 50 to 1000 Å, e.g., 100, 200, or 700 Å. The thickness difference can be calculated as the difference between the thickness of the inner region 50a and the thickness of the outer region 54a, or as the difference between the thickness of the inner region 50a and the thickness of the middle region 52a.

Figure 9A:
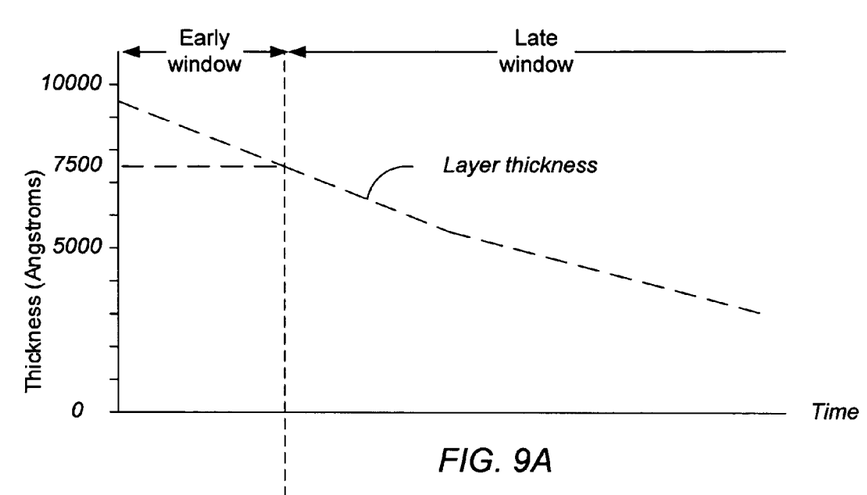
FIG. 9A is a graph illustrating metal layer thickness as a function of time.
Figure 9B:
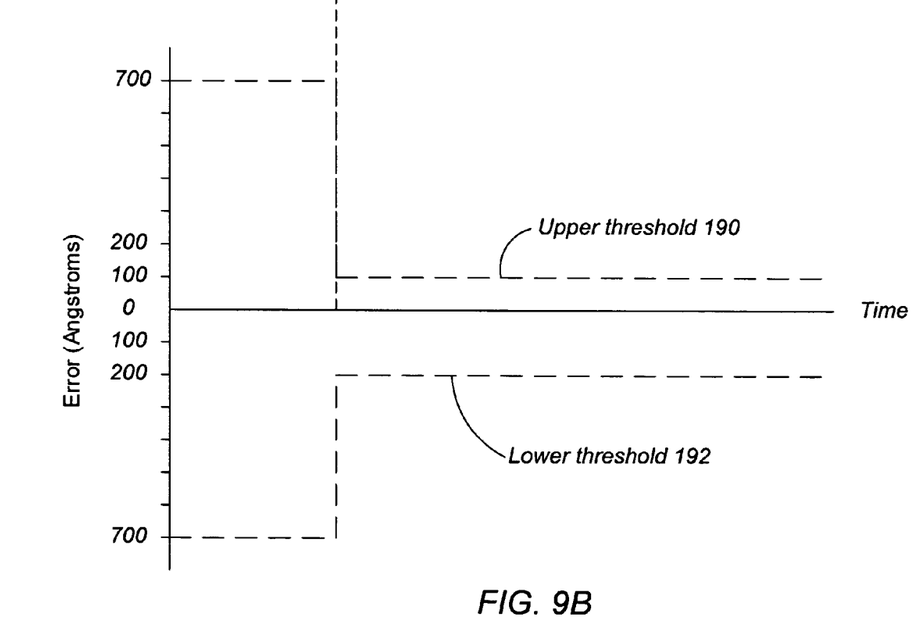
FIG. 9B is a graph illustrating error thresholds as a function of time.

Referring to FIGS. 9A and 9B, different error thresholds 190 and 192 can be used for different periods during the polishing process. For example, while a preselected region of the substrate, e.g., the inner region 50a, is thicker than a predetermined thickness (in the "early window") the error threshold can have a first value, e.g., 700 Å (the thicknesses of the different regions of the substrate are calculated by the signal processing system 152 as discussed above). On the other hand, when the preselected region of the substrate falls below the predetermined thickness (in the "late window"), the error threshold can be lowered to a different value, e.g., 100 Å. The predetermined thickness may be about 5000 to 10000 Å, e.g., 7500 Å. In one implementation, the predetermined thickness is a function of an initial layer thickness. For example, the predetermined thickness can be 3000 Å less than the initial average thickness of the layer. The ratio between the first threshold and the second threshold can be between 2:1 and 10:1, e.g., 7:1 or 3.5:1. Of course, far more complex error threshold functions are possible. In addition, the function may depend on thickness of multiple regions of the substrate, or on an average thickness of the layer across the substrate. In particular, the feedback control system 156 can be activated if the difference between the inner substrate region and either the middle region or the outer region exceeds the threshold. Alternatively, the error threshold may be a function of time rather than layer thickness.

In addition, an upper threshold 190 can be different from a lower threshold 192. Assuming that the error E is calculated as $E=T_{inner}-T_{outer}$, where $T_{inner}$ is the thickness of the inner region, and $T_{outer}$ is the thickness of a region surrounding the inner region, then the positive error threshold can be smaller than the negative error threshold. For example, during the "late window", the upper threshold can be 100 Å and the lower threshold can be −200 Å.

Returning to FIG. 8, once the error threshold system is activated, it calculates adjusted pressures (there can be a new pressure for each independently controllable zone of the carrier head) to apply to the substrate (step 178), and the substrate is polished using these adjusted pressures (step 180).

The polishing feedback system remains activated and continuously or periodically recalculates the polishing pressures as long as the thickness difference on the substrate is outside the threshold limits. However, once the thickness difference is inside the threshold limits, the closed-loop feedback control system is deactivated, the pressure parameters are set to the last values calculated by the feedback control system (step 184), and polishing returns to using pressure values that are not updated (step 172).

Without being limited to any particular theory, the behavior of a polishing system (in terms of reaction of the polishing rate to input variables such as the pressure) can be chaotic during the initial start-up of polishing. This may be due to factors such as stabilization of temperature or, particularly for copper polishing, initiation of the polishing mechanism (e.g., oxidization of the metal layer). By using larger error thresholds at the beginning of the polishing process, the closed loop system is not activated while the behavior of the polishing system is chaotic and unlikely to respond properly to the closed-loop control system. In addition, by avoiding unnecessary modifications to the polishing process parameters, the risk of unexpected polishing results is reduced.

The eddy current and optical monitoring systems can be used in a variety of polishing systems. Either the polishing pad, or the carrier head, or both can move to provide relative motion between the polishing surface and the substrate. The polishing pad can be a circular (or some other shape) pad secured to the platen, a tape extending between supply and take-up rollers, or a continuous belt. The polishing pad can be affixed on a platen, incrementally advanced over a platen between polishing operations, or driven continuously over the platen during polishing. The pad can be secured to the platen during polishing, or there could be a fluid bearing between the platen and polishing pad during polishing. The polishing pad can be a standard (e.g., polyurethane with or without fillers) rough pad, a soft pad, or a fixed-abrasive pad.

Although the invention has been described in the context of metal polishing, which uses the eddy current monitoring system to generate thickness measurements of the metal layer, the invention would also be applicable to oxide polishing, which could use an interferometer or spectrometer to generate thickness measurements of the oxide layer.

Although illustrated as positioned in the same hole, the optical monitoring system 140 could be positioned at a different location on the platen than the eddy current monitoring system 40. For example, the optical monitoring system 140 and eddy current monitoring system 40 could be positioned on opposite sides of the platen, so that they alternately scan the substrate surface. Various aspects of the invention still apply if the eddy current sensor uses separate drive and sense coils instead of a single coil.

The present invention has been described in terms of a preferred embodiment. The invention, however, is not limited to the embodiment depicted and described. Rather, the scope of the invention is defined by the appended claims.

What is claimed is:

1. A method of chemical mechanical polishing a substrate having a layer, comprising:
    polishing the substrate and applying a plurality of predetermined pressures to a plurality of regions of the substrate;
    monitoring a plurality of portions of the substrate during polishing with an in-situ monitoring system;
    determining a plurality of thicknesses of the layer of the substrate using data from the in-situ monitoring system, the plurality of thicknesses including a first thickness of the layer in a first portion of the substrate and a second thickness of the layer in a second portion of the substrate;
    determining whether a difference between the first thickness and the second thickness is outside a predetermined threshold; and
    only if the difference between the first thickness and the second thickness is outside the predetermined threshold, calculating a plurality of adjusted pressures in a closed-loop control system and applying the plurality of adjusted pressures to the plurality of regions of the substrate.

2. The method of claim 1, further comprising continuing to determine the plurality of thicknesses and recalculating the plurality of adjusted pressures continuously or periodically in the closed-loop control system.

3. The method of claim 2, further comprising continuing to determine whether a difference between the first thickness and the second thickness is outside the predetermined threshold.

4. The method of claim 3, wherein the step of recalculating halts if the difference between the first thickness and the second thickness returns to a value within the predetermined threshold.

5. The method of claim 4, further comprising applying a most recently calculated plurality of adjusted pressures to the plurality of regions of the substrate.

6. The method of claim 1, wherein the predetermined threshold includes an upper limit and a lower limit.

7. The method of claim 6, wherein an absolute value of the upper limit is different than an absolute value of the lower limit.

8. The method of claim 1, wherein the first portion and the second portion correspond to a first region and a second region from the plurality of regions.

9. The method of claim 8, wherein the plurality of regions of the substrate comprise concentric regions.

10. The method of claim 9, wherein the concentric regions include an inner region, a middle region and an outer region.

11. The method of claim 10, wherein the first region is the inner region and the second region is the middle region.

12. The method of claim 10, wherein the first region is the inner region and the second region is the outer region.

13. The method of claim 1, wherein calculating a plurality of adjusted pressures in the closed-loop control system includes calculating a plurality of adjusted pressures to achieve a target thickness profile.

14. The method of claim 1, wherein the in-situ monitoring system comprises an eddy current monitoring system and the layer is a metal.

15. The method of claim 1, wherein the in-situ monitoring system comprises an optical monitoring system and the layer is a dielectric.

16. The method of claim 1, wherein the predetermined threshold includes an initial threshold for a start of the polishing process and a second threshold for a period of polishing after the start of the polishing process.

17. The method of claim 16, wherein the second threshold is narrower than the initial threshold.

18. The method of claim 16, wherein the predetermined threshold is a function of at least one of the plurality of thicknesses to generate the initial threshold and the second threshold.

19. The method of claim 18, wherein the function is a step function.

20. The method of claim 16, wherein the predetermined threshold is a function of time to generate the initial threshold and the second threshold.

21. The method of claim 16, wherein a ratio between the initial threshold and the second threshold is between about 2:1 and 10:1.

22. The method of claim 1, further comprising:
continuing to polish the substrate and apply the plurality of predetermined pressures to the plurality of regions when the difference between the first thickness and the second thickness is inside the predetermined threshold.

23. A computer program product tangibly embodied in a computer readable medium including instructions for a processor to cause a polishing apparatus to perform operations, the operations comprising:
polishing a substrate and applying a plurality of predetermined pressures to a plurality of regions of the substrate;
monitoring a plurality of portions of the substrate during polishing with an in-situ monitoring system;
determining a plurality of thicknesses of a layer of the substrate using data from the in-situ monitoring system, the plurality of thicknesses including a first thickness of the layer in a first portion of the substrate and a second thickness of the layer in a second portion of the substrate;
determining whether a difference between the first thickness and the second thickness is outside a predetermined threshold; and
only if the difference between the first thickness and the second thickness is outside the predetermined threshold, calculating a plurality of adjusted pressures in a closed-loop control system and applying the plurality of adjusted pressures to the plurality of regions of the substrate.

24. A polishing system, comprising:
a polishing pad support;
a carrier head to hold a substrate and configured to apply a plurality of independently controllable pressures to a plurality of regions of the substrate;
an in-situ monitoring system to monitor a plurality of portions of the substrate during polishing; and
a controller configured to determine a plurality of thicknesses of a layer of the substrate using data from the in-situ monitoring system, determine whether a difference between a first thickness and a second thickness from the plurality of thicknesses is outside a predetermined threshold, and only if the difference between the first thickness and the second thickness is outside the predetermined threshold, calculate a plurality of adjusted pressures in a closed-loop control system and apply the plurality of adjusted pressures to the plurality of regions of the substrate.

* * * * *